United States Patent
Hakushi et al.

(10) Patent No.: US 7,427,031 B2
(45) Date of Patent: *Sep. 23, 2008

(54) SEMICONDUCTOR MEMORY DEVICE

(75) Inventors: Norihiko Hakushi, Hyogo (JP); Atsushi Ohba, Tokyo (JP); Yoshimasa Yoshimura, Tokyo (JP); Takeshi Nakayama, Tokyo (JP)

(73) Assignees: Renesas Technology Corp., Tokyo (JP); Renesas Device Design Corp., Hyogo (JP)

( * ) Notice: Subject to any disclaimer, the term of this patent is extended or adjusted under 35 U.S.C. 154(b) by 212 days.

This patent is subject to a terminal disclaimer.

(21) Appl. No.: 11/252,584

(22) Filed: Oct. 19, 2005

(65) Prior Publication Data

US 2006/0065746 A1     Mar. 30, 2006

Related U.S. Application Data

(62) Division of application No. 10/655,580, filed on Sep. 5, 2003, now Pat. No. 7,000,846.

(30) Foreign Application Priority Data

Sep. 6, 2002    (JP)    .............................. 2002-261460

(51) Int. Cl.
    *G06K 19/06*    (2006.01)
(52) U.S. Cl. .................. 235/492; 365/222; 365/226
(58) Field of Classification Search ............. 235/492, 235/436, 441, 438; 365/189.01, 222, 226, 365/230.1, 230.3
    See application file for complete search history.

(56) References Cited

U.S. PATENT DOCUMENTS

| | | | |
|---|---|---|---|
| 4,992,651 A | 2/1991 | Takahira | |
| 6,515,929 B1 | 2/2003 | Ting et al. | |
| 6,523,755 B2 | 2/2003 | Shinohara | |
| 6,683,817 B2 * | 1/2004 | Wei et al. | 365/230.03 |
| 7,061,786 B2 * | 6/2006 | Sakui | 365/63 |
| 7,203,116 B2 * | 4/2007 | Yahata et al. | 365/222 |
| 2002/0064079 A1 | 5/2002 | Sato et al. | |
| 2003/0156489 A1 | 8/2003 | Takeuchi et al. | |

FOREIGN PATENT DOCUMENTS

EP    0 566 306 A2    10/1993

(Continued)

OTHER PUBLICATIONS

Japanese Office Action issued Japanese Patent Application No. JP 2002-261460, dated Feb. 26, 2008.

*Primary Examiner*—Ahshik Kim
(74) *Attorney, Agent, or Firm*—McDermott Will & Emery LLP

(57) ABSTRACT

A semiconductor memory device including a flash memory and a RAM incorporating a pseudo-SRAM contained in an MCP, has an internal transfer control signal for controlling internal data transfer between the flash memory and pseudo-SRAM, and an external transfer control signal for controlling data transfer between an external CPU and pseudo-SRAM, as control signals for the pseudo-SRAM. A flash controller in the RAM controls the internal transfer control signal so as to suspend the internal data transfer between the flash memory and pseudo-SRAM when the external CPU requests access to the pseudo-SRAM during the internal data transfer.

3 Claims, 8 Drawing Sheets

FOREIGN PATENT DOCUMENTS

| | | |
|---|---|---|
| EP | 632463 A2 | 1/1995 |
| JP | 60-262258 | 12/1985 |
| JP | 5-299616 | 11/1993 |
| JP | 8-137736 | 5/1996 |
| JP | 11-110334 | 4/1999 |
| JP | 2000-172559 | 6/2000 |
| JP | 2002-170383 | 6/2002 |
| JP | 2002-312232 A | 10/2002 |

* cited by examiner

SEMICONDUCTOR MEMORY DEVICE

This application is a divisional of application Ser. No. 10/655,580 filed Sep. 5, 2003, now U.S. Pat. No. 7,000,846.

BACKGROUND OF THE INVENTION

1. Field of the Invention

The present invention relates to a memory system which is available for a small-sized information terminal such as a cellular phone.

2. Related Art

A memory system of a small-sized information terminal such as a cellular phone mainly includes a linear flash memory for storing CPU command codes and various data, and an SRAM for storing data temporarily as a work area of the CPU. Especially in a small-sized information terminal such as a cellular phone which is strictly limited in the mounting area, the linear flash memory and SRAM are contained in one package, which is known as a multi-chip package (MCP).

In the recent trend for higher function of terminals and higher speed of communications, a larger memory capacity has been strongly demanded, and the capacity shortage of the linear flash memory and SRAM has posed a problem.

To solve such problems, as for the SRAM, it is possible to increase the memory capacity by employing a pseudo-SRAM element which uses a dynamic memory cell of one-transistor type same as in the DRAM and has the same interface as that of the SRAM.

On the other hand, regarding the storage flash memory, the AND/NAND storage flash memories of block (sector) access type suited to application of large capacity storage are manufactured. However they cannot be easily coupled directly to the CPU bus owing to their characteristic in the specification. Therefore there are problems in which a dedicated interface circuit must be fitted externally or only low speed access is achieved by port connection with the CPU. Besides, since direct random access to the storage flash memory is impossible, in order to achieve a random access function, the data has to be transferred once onto the RAM and then the CPU has to access the RAM. This method requires a large capacity of RAM.

To solve such defects specific to the storage flange memory, the pseudo-SRAM element has been developed which incorporates the interface circuit or control functions of the storage flash memory (refer to Japanese Patent Application No. 2001-111259). It hence solves the problem of mismatching of the storage flash memory and CPU interface, and the memory capacity can be increased.

However, the following defects exist in data transfer in the MCP having such a pseudo-SRAM element. When an access from the external CPU occurs during data transfer between the storage flash memory and the pseudo-SRAM element, conflict occurs between transfer requests. It becomes a problem that how this conflict is arbitrated.

SUMMARY OF THE INVENTION

The invention is intended to solve above problems, and it is hence an object thereof to present a semiconductor memory device storing in one package a storage flash memory and a pseudo-SRAM element, which is capable of arbitrating conflict when an external CPU requests a data transfer during a data transfer action between the storage flash memory and the pseudo-SRAM element.

A semiconductor memory device according to the invention includes a first memory which is non-volatile and a second memory having a random access function. The first and second memories are contained in one package. The semiconductor memory is capable of performing internal data transfer between the first and second memories. The second memory has an internal data transfer control signal that controls the internal data transfer and an external transfer control signal that controls data transfer between an external CPU and the second memory. The second memory incorporates a controller that controls data access to the first and second memories. When an access to the second memory is requested from the external CPU during the internal data transfer, the controller controls the internal transfer control signal so that the internal data transfer is suspend.

The semiconductor device having such configuration suspends internal transfer when an external access is requested during internal data transfer, and hence can respond without causing disturbance in case of access conflict.

The controller may output a wait signal to request the external CPU to wait for access while the internal data transfer is suspended. This wait signal causes the access from the CPU to be kept in waiting state until the internal data transfer is suspended.

Further, the controller may store the address upon suspension when the internal data transfer is suspended, and restart the transfer from the stored address when resuming the internal data transfer. Thus, the internal data transfer can be executed adequately and efficiently.

During suspension of internal data transfer, the controller may resume the suspended internal data transfer when the external CPU does not access the second memory for a predetermined period during suspension of the internal data transfer. Thus, the internal data transfer can be resumed after the external access by the CPU is completed securely.

The controller may have means for storing a bit that indicates a command for the suspension of the internal data transfer from the external CPU. Thus, even in the case of an access from a CPU not having WAIT signal input, the access conflict can be arbitrated.

The memory region of the second memory may be divided into plural banks. Thus, during internal transfer, the data transfer to banks which are not engaged in data transfer between the first and second memories can be executed immediately without requiring arbitration.

The second memory may a memory having a dual port function. Thus, the second memory is always accessible, and conflict arbitration process by suspending data transfer in the midst of internal transfer is not required.

The controller may transfer predetermined data stored in the first memory to a predetermined region in the second memory automatically when the power is turned on. Storing the predetermined data to be transferred to the second memory when the power is turn on in the first memory allows an exclusive memory for storing the specified data to be not required, and thus the circuit scale and manufacturing cost can be reduced.

At this time, preferably, the controller should store transfer source address, transfer destination address, and amount of transfer data, relating to the predetermined data. These data enables data transfer.

The memory region in the first memory may be divided into plural sectors, and each sector may have a flag showing whether the sector includes or not the data to be transferred automatically when the power is turned on. The flag enables the type of the data stored in the sector of the first memory to be judged. Thus it can be managed to avoid unexpected rewriting or erasing of stored data.

When the second memory requires a refreshing operation for stored data and the refreshing operation is applied only to specified regions, the region of the second memory for storing the data transferred automatically when the power turned on may be set automatically to be the specified regions to which the refreshing operation is applied. Thus, secure data storing action can be achieved.

DESCRIPTION OF THE PREFERRED EMBODIMENTS

Referring now to accompanying drawings, preferred embodiments of the semiconductor memory device of the present invention are described in detail below.

First Embodiment 1.1 Configuration

Figure 1:
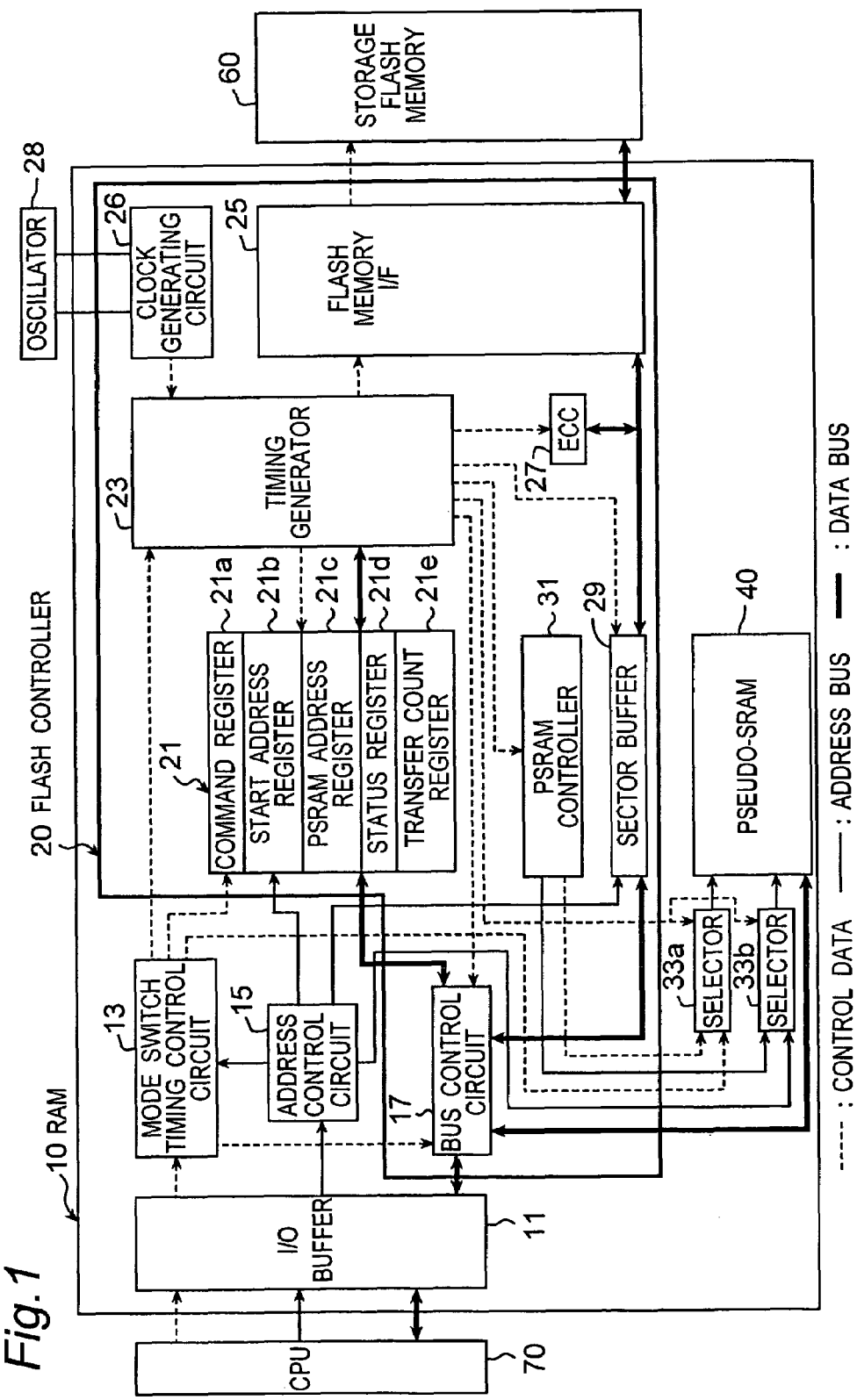
FIG. 1 is a structural diagram of a semiconductor memory device according to the present invention (first embodiment).
Figure 2:
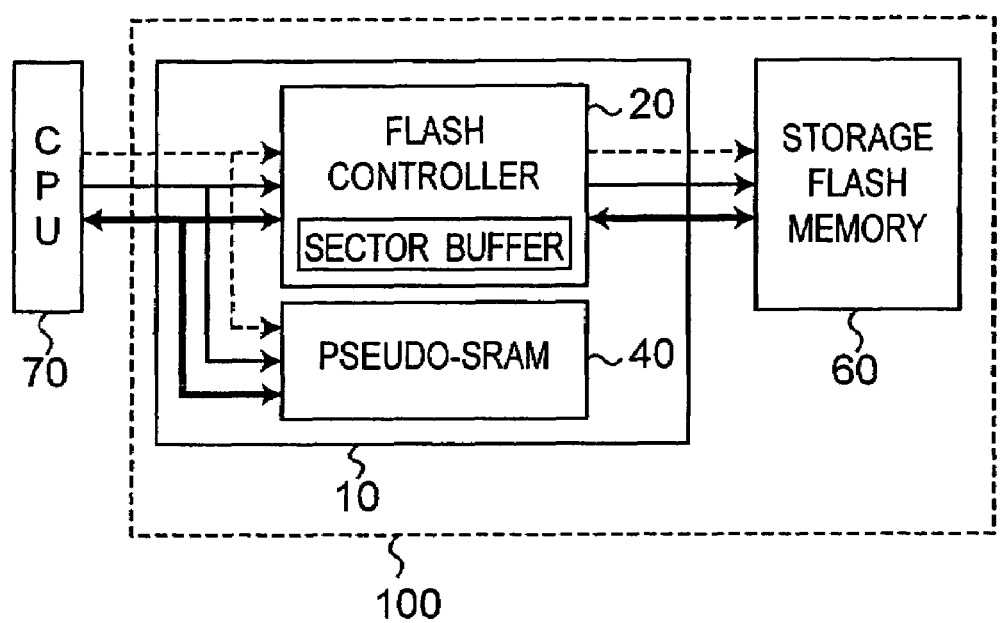
FIG. 2 is a diagram showing a configuration of MCP of the semiconductor memory device.

FIG. 1 shows a configuration of a semiconductor memory device according to the present invention. The semiconductor memory device includes a random access memory (hereinafter referred to as RAM) 10, and a storage flash memory (hereinafter referred to as flash memory) 60. The RAM 10 and flash memory 60 are contained in one MCP 100 as shown in FIG. 2.

As shown in FIG. 1, the RAM 10 is connected to the flash memory 60 and CPU 70. The RAM 10 has a large capacity of pseudo-SRAM 40 as a data storage unit. It should be noted that the pseudo-SRAM is a large capacity memory that employs a one-transistor type dynamic memory cell having the same configuration as the memory cell of a general DRAM in which one cell includes one transistor and one capacitor, and has the same interface specification as that of the SRAM.

As shown in FIG. 1, the RAM 10 has a flash controller 20 for generating control signals and timings necessary for operation of the flash memory 60 and pseudo-SRAM 40.

The flash controller 20 includes a bus control circuit 17, a register group 21, a timing generator 23, a flash memory interface (I/F) 25, a clock generating circuit 26, an ECC circuit 27, a sector buffer 29, and a PSRAM controller 31. The flash controller 20 includes, for example, a sequence circuit (hardware) for generating various signals in synchronism with the clock. It should be noted that the flash controller 20 may incorporate a built-in type CPU core and a memory storing its command codes and the hardware may be controlled by it. In such a configuration, a more flexible and advanced control can be realized.

The RAM 10 also has selectors 33a,. 33b for switching the address and control information to be entered in the pseudo-SRAM 40. The selectors 33a, 33b switch the address and control information to be entered in the pseudo-SRAM 40 between during data transfer between the pseudo-SRAM 40 and flash memory 60 and during other data transfer.

The register group 21 includes a command register 21a for storing the command from the CPU 70, a start address register 21b for storing the sector address to be accessed on the flash memory 60, a PSRAM address register 21c for storing the address to be accessed on the pseudo-SRAM 40, a status register 21d for storing status information, and a transfer count register 21e including count of the transfer data counted in a predetermined unit.

The clock generating circuit 26 generates a basic internal clock by using an output from an external oscillator 28.

The ECC circuit 27 processes the data transferred between the flash memory 60 and sector buffer 29, by generating a check code (ECC coding process) during data writing into the flash memory 60, or detecting and/or correcting error (ECC decoding process) during data reading from the flash memory 60.

The timing generator 23 generates timings of blocks in the flash controller 20. That is, the timing generator 23 generates, asynchronously with the clock of the CPU 70, all timings necessary for operation of the flash memory 60 and pseudo-SRAM 40 from the basic internal clock generated in the clock generating circuit 26.

The operation sequence of the flash controller 20 is determined by parameters and commands stored by the CPU 70 to the registers 21a to 21e in the register group 21. That is, the flash controller 20 generates control signals according to the parameters and commands stored in the registers 21a to 21e by the CPU 70, to control the flash memory 60 and pseudo-SRAM 40.

Data transfer between the flash memory 60 and CPU 70 are executed by way of a sector buffer 29. The PSRAM controller 31 controls the timing generator 23 to control data transfer between the sector buffer 29 and pseudo-SRAM 40.

1.2 Data Transfer Between RAM and Flash Memory

Data transfer from the flash memory 60 to the RAM 10 is described. First, data is transferred from the flash memory 60 to the RAM 10 in the following procedures.

The CPU 70 writes the sector address and read command of the flash memory 60 to be read out into the start address register 21b and command register 21a in the register group 21. The sector address and command (CMD) are written in this order. Writing into the command register 21a is detected by an address control circuit 15 and a mode switch/timing control circuit 13. When writing is detected, a trigger signal is put into the flash controller 20. This trigger signal causes an operation to shift to an internal operation controlled by the flash controller 20. According to the command code written in the command register 21a, the signal and timing necessary for reading the flash memory 60 are generated from a reference clock of the clock generating circuit 26. According to this timing, data of one sector is read out from a sector at an address stored in the sector address register 21b, and is transferred to the sector buffer 29 by way of the flash memory I/F 25.

Transfer of sector data from the sector buffer to the specified address of the pseudo-SRAM is executed as follows.

The CPU 70 sets the write address in the pseudo-SRAM 40 to the PSRAM address register 21c and then writes the command code in the command register 21a. The writing of command into the command register 21a causes the flash controller 20 to start a control of the internal operation. By the bus control circuit 17, the bus is connected between the sector buffer 29 and pseudo-SRAM 40. The data is read out sequentially onto the internal bus from the beginning data in the sector buffer 29 by the control of the timing generator 23, and simultaneously written into the pseudo-SRAM 40 sequentially from the specified address. Thus, the data is transferred from the flash memory 60 into the RAM 10 (that is, the pseudo-SRAM 40). Data transfer from the RAM 10 to the flash memory 60 can be realized in the same manner.

1.3 Procedures of Suspending and Resuming Internal Data Transfer

When an access is requested from the external CPU 70 in the midst of data transfer between the pseudo-SRAM 40 and flash memory 60, the RAM 10 stops the data transfer. Later, when the access by the CPU 70 is terminated, the data transfer between the pseudo-SRAM 40 and flash memory 60 is resumed. This procedure is described below.

Prior to description of the procedure, description is made to the control signals relating to the pseudo-SRAM 40.

Various signals are defined for the pseudo-SRAM 40 as control signals to be used in a control of data transfer accessed from the external CPU 70. For example, the following control signals are used.

/CS1 (chip select): This is made active when the external CPU 70 requests access to the pseudo-SRAM 40.

/OE (output enable): This is made active when reading data from the pseudo-SRAM 40 is enabled.

/WE (write enable): This is made active when writing data into the pseudo-SRAM 40 is enabled.

Herein, the symbol "/" in the signal name means the signal operates in active low. For example, when the external CPU 70 accesses the pseudo-SRAM 40, the external chip select signal /CS1 is made active ("L").

Further, in the pseudo-SRAM 40, the following control signals are defined, aside from the control signals to the external access mentioned above, for use only in data transfer between the internal flash memory 60 and other memory (herein such data transfer between elements inside the semiconductor is called "internal transfer").

/TCE (chip select): This is made active when an internal transfer to the pseudo-SRAM is requested.

/RCE (read enable): This is made active when reading data from the pseudo-SRAM is enabled in internal transfer.

/WCE (write enable): This is made active when writing data into pseudo-SRAM is enabled in internal transfer.

Figure 3:
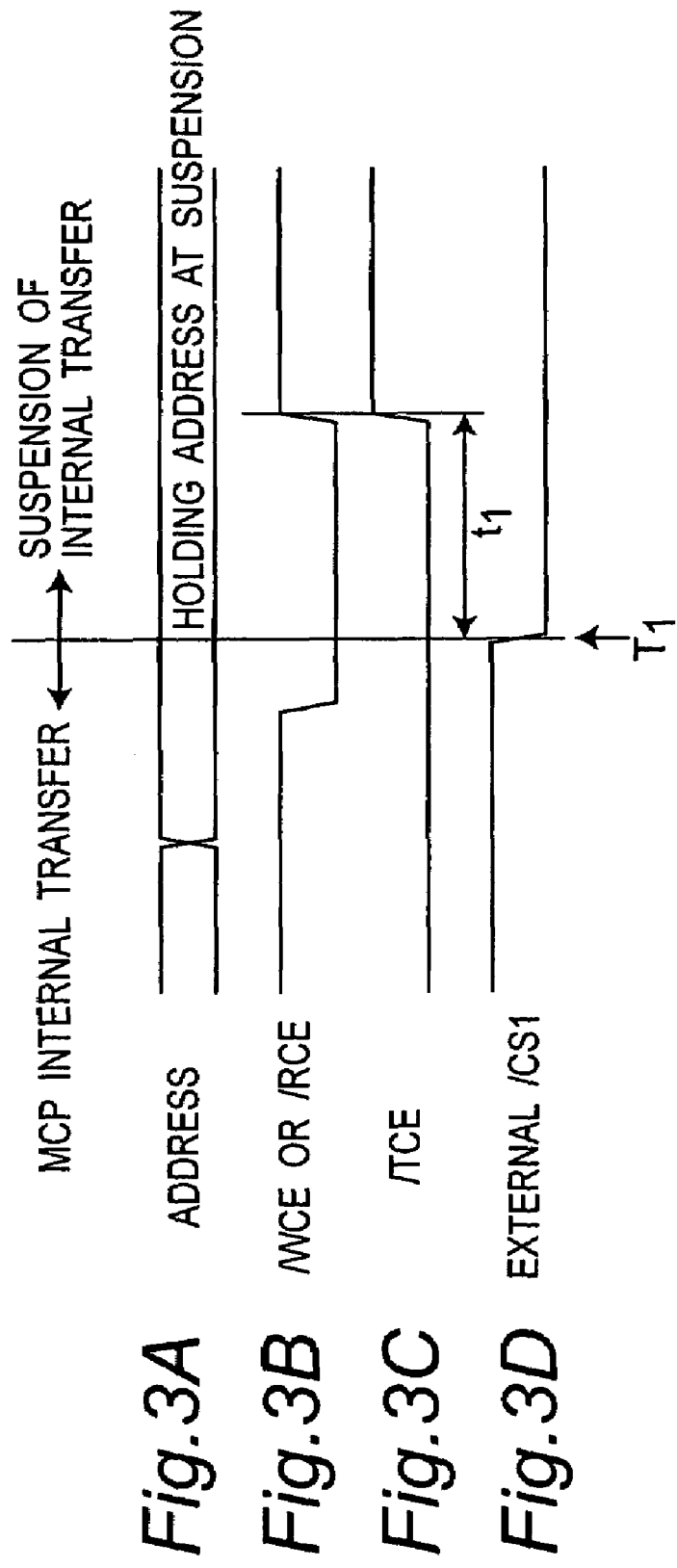
FIGS. 3A to 3D are diagrams for explaining the suspending action of internal transfer of the semiconductor memory device.

Referring to FIG. 3, the description is made to procedure of suspending when the CPU 70 requests access to the pseudo-SRAM 40 during internal transfer.

When the external chip select signal /CS1 is made active ("L") during internal transfer (refer to FIG. 3D), the PSRAM controller 31 in the flash controller 20 sets the control signals for internal transfer /TCE, /RCE and /WCE automatically to inactive ("H") state after a specified time (t1) elapses from the moment (T1) of external chip select signal /CS1 becoming active ("L") (refer to FIGS. 3B and 3C). As a result, the internal transfer is suspended. The specified time t1 is set to a duration required to terminate the transfer in progress completely from the moment (T1) of external chip select signal /CS1 becoming active ("L") until the suspension is started.

At this time, the address of the page of the suspended transfer source data is stored in the register in the flash controller 20. The address of the suspended page may be stored in the specified register in the flash controller 20 as the address value itself, or the start address of internal transfer and the count value of the internally transferred data may be stored. This is because the address of the suspended page can be easily calculated from the start address of internal transfer and the count value of the internally transferred data. At this time, the start address of the internal transfer is stored in the start address register 21b, and the count value of the internally transferred data is stored in the transfer count register 21e.

Regarding the access to the pseudo-SRAM 40 from the external CPU, since the response time is later than usual operation due to the suspending process of internal transfer, the flash controller 20 can issue a wait signal to request to wait the access for the CPU 70.

Figure 4:
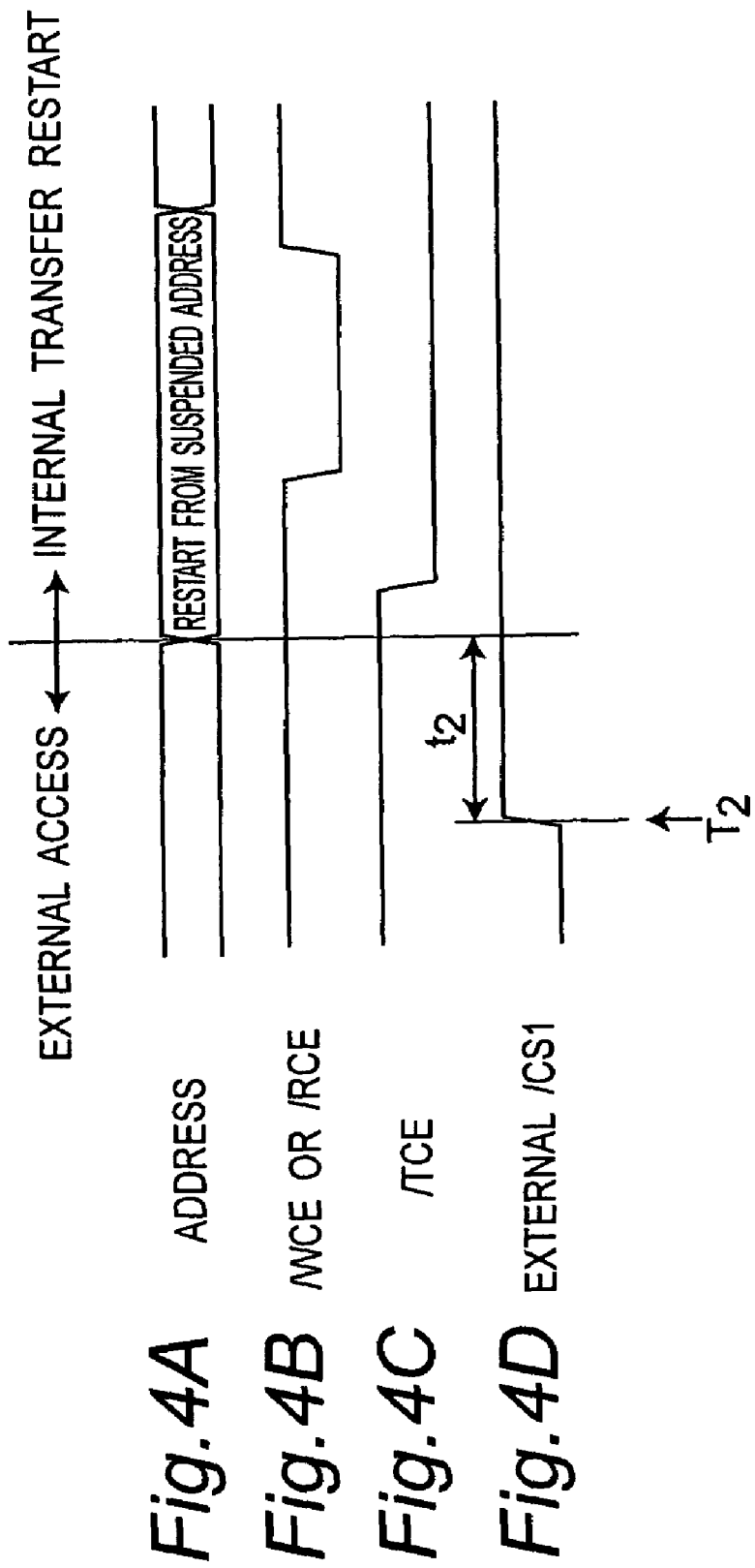
FIGS. 4A to 4D are diagrams for explaining the resuming action of internal transfer of the semiconductor memory device.

Next, referring to FIG. 4, a description is made to the procedure for resuming internal transfer after the access of the CPU 70 to the pseudo-SRAM 40 is terminated.

If, in the pseudo-SRAM 40 suspending the internal transfer by external access from the CPU 70, the chip enable signal for external access /CS1 is not made active within a specified time (t2) from the moment (T2) of the chip enable signal for external access /CS1 being made inactive ("H"), the PSRAM controller 31 automatically sets the control signal for internal transfer /TCE active ("L"), and successively the write enable signal for internal transfer /WCE or read enable signal /RCE is set active. Thus, the suspended internal transfer is resumed. At this time, the transfer is resumed from the address being stored in the flash controller 20, and therefore the data transfer can be efficiently finished neither too much nor too little. The reason for waiting for the specified time t2 before resuming transfer is because after finishing of one external access, the other external access may start immediately, and thus it needs to judge if there is no consecutive external access after finishing the one external access.

Thus, the semiconductor memory device of the embodiment can suspend and resume the internal transfer action in progress in the event of an access from the external CPU 70, and hence can respond without disturbance to conflict of internal and external accesses. Also the semiconductor memory device has a function of issuing a wait signal to inform the external CPU 70 of the suspension of internal transfer action and a function of restoring the transfer resuming address, and thus internal and external data transfer can be completed without requiring unnecessary waiting time of the CPU 70 and the data transfer performance of the system can be enhanced.

Second Embodiment

In the first embodiment, control signals about the pseudo-SRAM 40 are classified into those relating to the access from outside of the semiconductor memory device and others relating to the access from inside of the semiconductor memory device. The chip select signal /CS1 as access request from the external CPU 70 is used as the trigger to control suspending or resuming internal transfer, but its timing much depends on the CPU 70. Thus, it is hard to assure a desired performance, and arbitration may be impossible for a CPU having no wait signal input. In this embodiment, accordingly, a description is made to procedures for suspending and resuming the internal transfer without depending on the command-input timing by the CPU 70.

Figure 5:
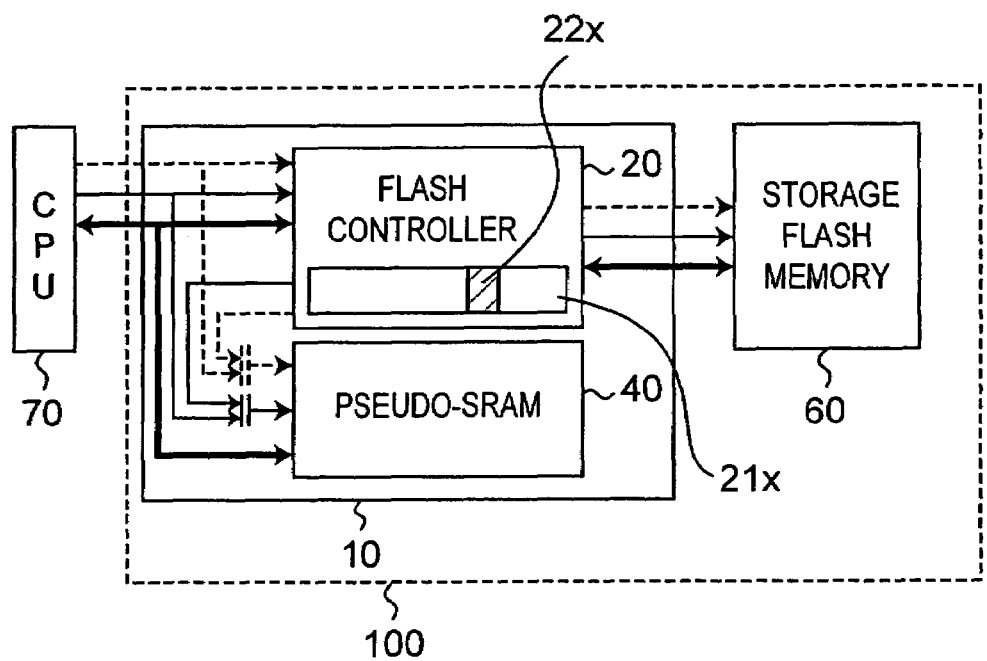
FIG. 5 is a diagram for explaining internal suspend bits of a semiconductor memory device in the second embodiment.

As shown in FIG. 5, a control register 21x is prepared in the register group 21 in the flash controller 20. The control register 21x has bits for various settings. For example, it has bits for specifying the write control and transfer size. In particular, in this embodiment, the control register 21x has an internal transfer suspend bit 22x. This internal transfer suspend bit 22x is a bit for instructing suspension of internal transfer by the CPU 70, and is set to "1" when the CPU 70 requests access to the pseudo-SRAM 40 during internal transfer.

That is, when requesting access to the pseudo-SRAM 40, the CPU 70 sets "1" to the internal transfer suspend bit 22x and notifies the semiconductor memory device that the access request is presented from the host computer. When this bit is set in "1", the flash controller 20 immediately suspends the internal transfer, and changes over control lines from the PSRAM controller 31 to the external interface, and passes the CPU 70 the access right.

The control register 21x is a register capable of writing and reading. A value of the register 21x is controlled so that it is held at "0" until the internal transfer suspending process is actually completed, and at "1" only when it is ready to accept a control signal from outside. Accordingly, by reading this bit, the CPU 70 can securely confirm the internal operation state and clear the conflict to double accesses. That is, it can be judged that the internal transfer action is in process when this bit is "0", and the internal transfer is suspended when this bit is "1".

The suspended internal transfer is resumed by setting the internal transfer suspend bit 22x to "0". That is, since the external access is under the control of the CPU 70, when the external access is terminated, the CPU 70 sets the suspend bit 22x at "0". When the suspend bit 22x is set at "0", the flash controller 20 judges that the external access is terminated, and makes immediately the control signal from the PSRAM controller 31 active to resume the suspended internal transfer. At this time, the addresses held in the register group 21 at the time of suspension are used as addresses of the transfer source and destination of data to be resumed for transfer.

Thus, the semiconductor memory device of this embodiment can settle the conflict of internal and external accesses, without depending on the command writing timing from the CPU 70, by using the flag bit indicating the suspend request from the CPU 70, so that the data transfer performance of the system can be enhanced while maintaining the versatility of the memory.

Third Embodiment

Figure 6:
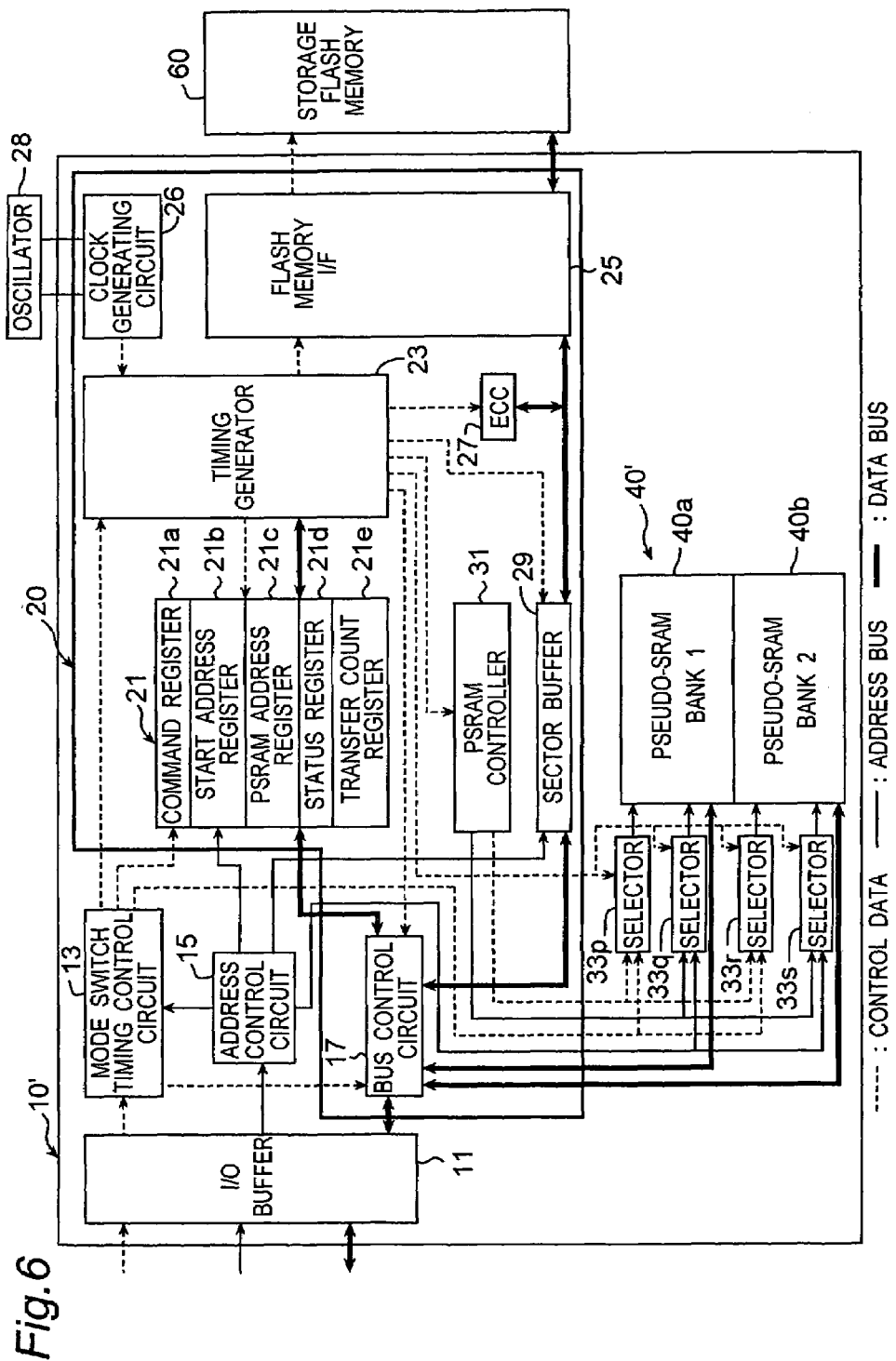
FIG. 6 is a structural diagram of a semiconductor memory device of the present invention having a pseudo-SRAM with two banks (third embodiment).

In the first embodiment, the pseudo-SRAM 40 has only one memory space. Thus, if accesses from the flash memory 60 and CPU 70 conflict, arbitration by the flash controller 20 is required, and one data transfer must be withheld until the other data transfer is complete. In this embodiment, accordingly, as shown in FIG. 6, the memory space of the pseudo-SRAM 40' is divided into two banks 40a and 40b, and each can be controlled independently. Therefore, even during the internal transfer, data transfer to the bank of the pseudo-SRAM 40' which is not engaged in data transfer with the flash memory 60 can be executed immediately without arbitration. If access to the other bank engaged in data transfer with the flash memory 60 occurs, the competitive data transfers can be processed sequentially by the procedure of suspending and resuming data transfer as mentioned in the foregoing embodiment.

Furthermore, type of data to be stored in each bank may be determined. This can reduce the frequency of conflicts between the external access and internal transfer. For example, when the bank 1 (40a) is exclusively for user data, and the bank 2 (40b) is exclusively for the operating system or application programs, basically, only the CPU 70 can access the bank 2 (40b), and access conflict occurs only when handling the user data in the bank 1, and thus the frequency of conflicts is substantially lowered and the system efficiency is enhanced.

In this embodiment, the memory space is divided into two banks, but it may be divided into more banks depending on the system configuration and applications.

Fourth Embodiment

Figure 7:
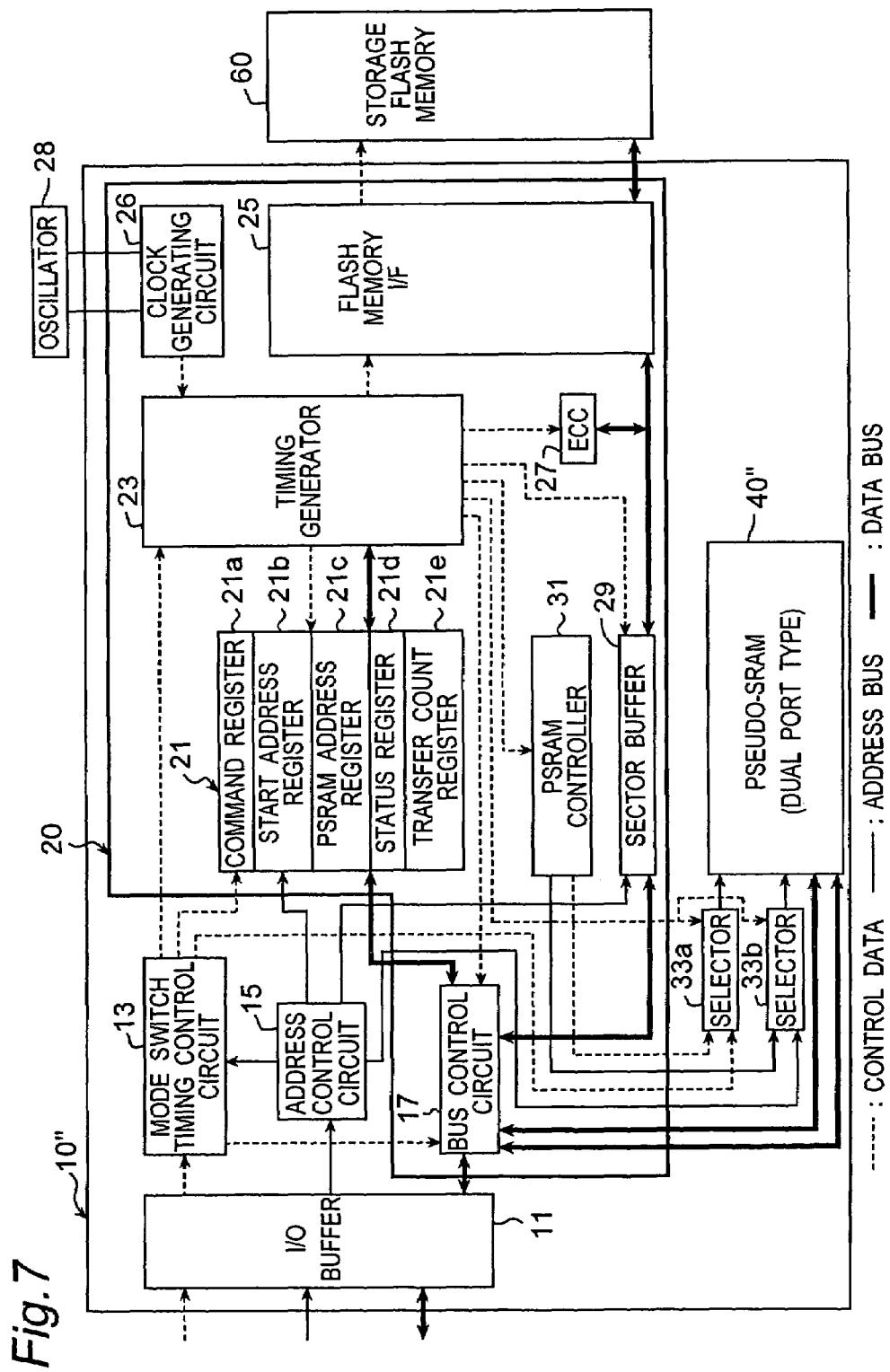
FIG. 7 is a structural diagram of a semiconductor memory device of the present invention having a dual port pseudo-SRAM (fourth embodiment).

FIG. 7 shows a configuration of a different embodiment of the semiconductor memory device. In this embodiment, the incorporated random access memory is a pseudo-SRAM 40" having a dual port function. In the pseudo-SRAM 40" having a dual port function, data writing and reading can be done at the same time, and arbitration is not required for simultaneous accesses to the pseudo-SRAM 40" from the CPU and flash memory.

As shown in FIG. 7, the data buses between the pseudo-SRAM 40" and CPU 70 and between the pseudo-SRAM 40" and flash memory 60 is configured to correspond to the dual ports, and thus the CPU 70 and the flash memory 60 can always access the pseudo-SRAM 40" and it does not require conflict arbitration process by suspending the data transfer in the midst of internal data transfer.

That is, according to this embodiment, when the program code and user data are loaded in the same memory space on the pseudo-SRAM 40", in order to avoid conflict of accesses, it is not necessary to prepare bank and memory exclusively for program code storage. Thus the chip size and manufacturing cost can be curtailed as compared with the foregoing embodiments, and the response to external access can also be improved.

Fifth Embodiment

A boot code transfer function according to the invention in each semiconductor memory device mentioned in the foregoing embodiments is described.

"The boot transfer function" of the invention refers to a function of executing data transfer automatically from a specified region of the flash memory (60) to a specified region of pseudo-SRAM 40, 40', . . . when a power-on reset signal (a signal that instructs reset when the power of the semiconductor memory device is turned on) is made active. At this time, the data to be transferred is the boot code which is data to be first read by the CPU 70 when the power on. This boot code is stored in a specified region of the flash memory (60).

When the power-on reset signal is made active, the register group 21 of the flash controller 20 provided in the RAM 10 is initialized, and each register value is set to a default value. This default value is set in a value necessary for executing the boot transfer, and hence the boot code is transferred in conjunction with the power-on reset. The data necessary for boot code transfer includes the beginning address of the transfer source data on the flash memory 60, beginning address of the transfer destination on the pseudo-SRAM 40, . . . and number of transfer sectors. These information are set in the specified registers as default values.

TABLE 1

| Register | Default value |
| --- | --- |
| Start address register | Beginning address of transfer source data on flash memory. |

TABLE 1-continued

| Register | Default value |
|---|---|
| PSRAM address register | Beginning address of transfer destination on pseudo-SRAM. |
| Transfer count register | Total number of sectors of boot transfer. (size of boot code). |

According to power-on reset, each register value of the register group 21 is set to a default value. When the value of the command register 21a is set finally, loading of boot code into the specified region of the pseudo-SRAM 40, . . . , from the specified region of the flash memory 60 is started automatically according to the default value of the register.

Thus, by loading the pseudo-SRAM 40, . . . with the boot code simultaneously with the moment of power on, exclusive memory for storing the boot code required in the conventional system is no longer needed, and the number of components of the semiconductor memory device can be reduced, and hence the manufacturing cost is curtailed and the mounting area can be reduced.

Since the pseudo-SRAM 40, . . . which is loaded with the boot code uses a DRAM, periodic refreshing is needed for holding the data. There is a refreshing operation in which the memory cell region is segmented for the purpose of saving the power consumption and only the necessary portions of all segmented regions are refreshed as a data storing region (hereinafter, this operation is called "partial refreshing"). Accordingly, the region for storing the boot code on the pseudo-SRAM is set as a data storing region automatically at the same time as boot transfer, and then the partial refreshing is applied to the region storing the boot code on the pseudo-SRAM. By such a setting, while securely storing the transfer boot code by partial refreshing, the power consumption can be kept to a minimum. It should be noted that other regions than the area for storing the boot code may be also set as a data storing region as required.

Figure 8:
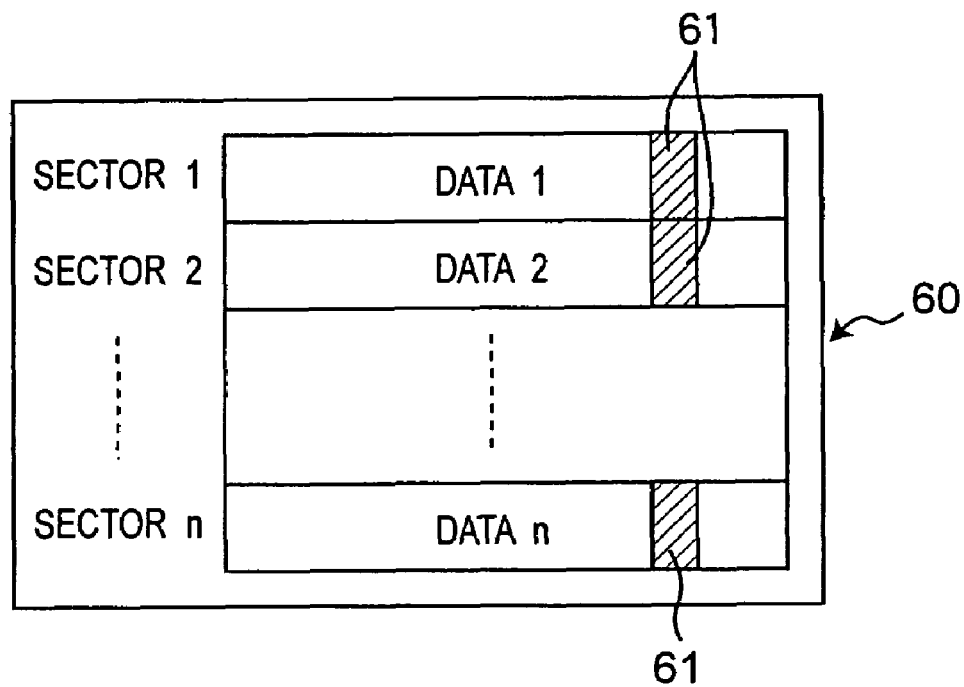
FIG. 8 is a diagram explaining a flag provided per sector of flash memory that shows whether the data stored in the sector is boot code or not.

Further, as shown in FIG. 8, sectors of the flash memory 60 may be added with flags 61 each showing whether data stored in the corresponding sector is boot code or not. Accordingly, even if the boot code is divided and stored in different memory blocks, the boot code can be transferred by searching the boot code based on this flag 61. Moreover, with reference to the flag 61, the type of the data stored in the sector can be judged, and thus data management is possible so that the stored data is not rewritten or erased unexpectedly. For example, the user data which is stored can not be unexpectedly rewritten or erased.

Still more, a new flag may be added to each sector, which shows whether the next sector of the corresponding sector stores the boot code or not. Thus, the same effect as in the flag 61 can be obtained.

According to the invention, in the semiconductor memory device having a first memory nonvolatile and a second memory capable of random access contained in one package, conflict can be arbitrated if transfer is requested from an external CPU during data transfer operation between the first and second memories.

Moreover, since the specified data is loaded automatically from the first memory into the second memory when the device powered on, exclusive memory devices for storing specified data is not needed, and the circuit scale and manufacturing cost can be reduced.

What is claimed is:

1. A semiconductor memory device comprising:
a first memory which is non-volatile; and
a second memory having a random access function, the first and second memories contained in one package, and the semiconductor memory capable of performing internal data transfer between the first and second memories,
wherein the second memory has an internal data transfer control signal that controls the internal data transfer, and an external transfer control signal that controls data transfer between an external CPU and the second memory,
the second memory incorporates a controller that controls data access to the first and second memories, and
when an access to the second memory is requested from the external CPU during the internal data transfer, the controller controls the internal transfer control signal so that the internal data transfer is suspended.

2. The semiconductor memory device according to claim 1, wherein the memory region of the second memory is divided into plural banks.

3. The semiconductor memory device according to claim 1, wherein the second memory is a memory having a dual port function.

* * * * *